United States Patent
Sun et al.

(10) Patent No.: US 7,126,160 B2
(45) Date of Patent: Oct. 24, 2006

(54) II-VI/III-V LAYERED CONSTRUCTION ON INP SUBSTRATE

(75) Inventors: Xiaoguang Sun, Woodbury, MN (US); Thomas J. Miller, Woodbury, MN (US); Michael A. Haase, Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/871,424

(22) Filed: Jun. 18, 2004

(65) Prior Publication Data

US 2005/0280013 A1 Dec. 22, 2005

(51) Int. Cl.
*H01L 33/00* (2006.01)
(52) U.S. Cl. .......................... 257/98; 257/13
(58) Field of Classification Search ............. 257/98, 257/13

See application file for complete search history.

(56) References Cited

U.S. PATENT DOCUMENTS

| | | | |
|---|---|---|---|
| 5,206,871 | A | 4/1993 | Deppe et al. |
| 5,544,193 | A | 8/1996 | Devaud-Pledran et al. |
| 5,732,103 | A | 3/1998 | Ramdani et al. |
| 5,956,362 | A | 9/1999 | Yokogawa et al. |

FOREIGN PATENT DOCUMENTS

| | | |
|---|---|---|
| JP | 7-249835 | 9/1995 |
| JP | 07249835 A * | 9/1995 |
| JP | 2000-89180 | 3/2000 |
| JP | 2003-124508 | 4/2003 |
| WO | WO 02/089268 A2 | 11/2002 |

OTHER PUBLICATIONS

Theodor Tamir (Ed.), "Guided-Wave Optoelectroncs," 2$^{nd}$ Edition, Springer-Verlag.

(Continued)

*Primary Examiner*—Thomas L. Dickey
(74) *Attorney, Agent, or Firm*—Philip Y. Dahl; Douglas B. Little

(57) ABSTRACT

A layered construction is provided comprising an InP substrate and alternating layers of II-VI and III-V materials. The alternating layers of II-VI and III-V materials are typically lattice-matched or pseudomorphic to the InP substrate. Typically the II-VI material is selected from the group consisting of ZnSe, CdSe, BeSe, MgSe, ZnTe, CdTe, BeTe, MgTe, ZnS, CdS, BeS, MgS and alloys thereof, more typically selected from the group consisting of CdZnSe, CdMgZnSe, BeZnTe, and BeMgZnTe alloys, and is most typically $Cd_xZn_{1-x}Se$ where x is between 0.44 and 0.54. Typically the III-V material is selected from the group consisting of InAs, AlAs, GaAs, InP, AlP, GaP, InSb, AlSb, GaSb, and alloys thereof, more typically selected from the group consisting of InP, InAlAs, GaInAs, AlInGaAs and GaInAsP alloys, and is most typically InP or $In_yAl_{1-y}As$ where y is between 0.44 and 0.52. In one embodiment, the layered construction forms one or more distributed Bragg reflectors (DBR's). In another aspect, the present invention provides a layered construction comprising: an InP substrate and a distributed Bragg reflector (DBR) having a reflectivity of 95% or greater which comprises no more than 15 layer pairs of epitaxial semiconductor materials. In another aspect, the present invention provides a laser comprising a layered construction according to the present invention. In another aspect, the present invention provides a photodetector comprising a layered construction according to the present invention.

35 Claims, 3 Drawing Sheets

OTHER PUBLICATIONS

Streubel, K., Rapp, S., André, J., and Wallin, J.; "Room-Temperature Pulsed Operation Of 1.5-μm Vertical Cavity Lasers With An InP-based Bragg Reflector", IEEE Photon. Technology Letters, vol. 8, No. 9, Sep. 1996, pp. 1121-1123.

Debray, J. P., Bouché, N., LeRoux, G., Raj, R., and Quillec, M.; "Monolithic Vertical Cavity Device Lasing at 1.55 μm in InGaAlAs System", Electronics Letters, vol. 33, No. 10, May 8, 1997, pp. 868-869.

Nakagawa, S., Hall, E., Almuneau, G., Kim, J. K., Buell, A., Kroemer, H., and Coldren, L.A., "88°C., Continuous-Wave Operation Of Apertured, Intracavity Contacted, 1.55 μm Vertical-Cavity Surface-Emitting Lasers", Applied Physics Letters, vol. 78, No. 10. Mar. 5, 2001, pp. 1337-1339.

Choquette, K. D.; "The Race Toward Long Wavelength VCSELs", Conference Proceedings of 14th Annual Meeting Of The IEEE Lasers and Eklectro-Optics Society (LEOS), vol. 2, 2001, pp. 594-595.

Karim, A., Black, A., Abraham, P., Lofgreen, D., Chiu, Y. J., Piprek, J., and Bowers, J. E.; "Long Wavelength Vertical-Cavity Lasers and Amplifiers", Proc. 5th Optoelectronics Communications Conference, Chiba, Japan, Jul. 2000, paper 13C2-1, pp. 402-403.

Ren, Xiaomin et al., "Key Technologies for Novel Wavelength-Selective Photodetectors," Optoelectronics, Proceeding of the Sixth Chinese Symposium, Sep. 12, 2003, pp. 54-57.

Sun et al., "GaAsSb Resonant-Cavity-Enhanced Photodetector Operating at 1.3 μm", *IEEE Photonics Technology Letters*, vol. 14, No. 5, pp. 681-683, May 2002.

Sun et al., "1.31 μm GaAsSb resonant-cavity-enhanced separate absorption, charge and multiplication avalanche photodiodes with low noise", *Journal of Applied Physics*, vol. 93, No. 1, pp. 774-776, Jan. 1, 2003.

Dental et al., "High Quantum Efficiency, Long Wavelength InP/InGaAs Microcavity Photodiode", *Electronics Letters*, vol. 27, No. 23, pp. 2125-2127, Nov. 7, 1991.

* cited by examiner

II-VI/III-V LAYERED CONSTRUCTION ON INP SUBSTRATE

FIELD OF THE INVENTION

This invention relates to devices, such as lasers or photodetectors, including Vertical Cavity Surface Emitting Lasers (VCSEL's), comprising an InP substrate and alternating layers of II-VI and III-V materials which typically form a Distributed Bragg Reflector (DBR).

BACKGROUND OF THE INVENTION

Japanese Unexamined Patent Application (Kokai) 2003-124508 purports to claim light-emitting diodes having AlGaInP-type light-emitting layers. (Claims 1–8). The reference emphasizes the "grid-matching" of layers with a GaAs substrate at paragraphs 2, 15 and 21 and at claim 1. The reference purports to claim light-emitting diodes with AlGaInP-type light-emitting layers that contain DBR layers having a structure comprising laminated pairs of Group II-VI material layers and AlGaAs-type or AlGaInP-type material layers. (Claims 2–4). The reference purportedly discloses light-emitting diodes with AlGaInP-type light-emitting layers that contain GaAlAs/ZnSe DBR layers (FIGS. 1–3, reference number 2, and accompanying description) on a GaAs substrate, and optionally a second DBR layer which is a GaAlAs/AlAs DBR layer (FIG. 3, reference number 10, and accompanying description).

U.S. Pat. No. 5,206,871 purportedly discloses a VCSEL comprising mirrors comprising alternating layers of GaP or ZnS and layers of borosilicate glass, CaF2, MgF2 or NaF.

U.S. Pat. No. 5,732,103 purportedly discloses a VCSEL comprising an InP substrate and lattice-matched mirror stacks comprising alternating layers of II-VI materials, in particular ZnCdSe/MgZnCdSe.

U.S. Pat. No. 5,956,362 purportedly discloses a VCSEL.

International Patent Publication No. WO 02/089268 A2 purportedly discloses high contrast reflective mirrors for use in VCSEL's which comprise oxide materials.

SUMMARY OF THE INVENTION

Briefly, the present invention provides a layered construction comprising an InP substrate and alternating layers of II-VI and III-V materials. The alternating layers of II-VI and III-V materials are typically lattice-matched or pseudomorphic to the InP substrate. Typically the II-VI material is selected from the group consisting of ZnSe, CdSe, BeSe, MgSe, ZnTe, CdTe, BeTe, MgTe, ZnS, CdS, BeS, MgS and alloys thereof, more typically selected from the group consisting of CdZnSe, CdMgZnSe, BeZnTe, and BeMgZnTe alloys, and is most typically $Cd_xZn_{1-x}Se$ where x is between 0.44 and 0.54. Typically the III-V material is selected from the group consisting of InAs, AlAs, GaAs, InP, AlP, GaP, InSb, AlSb, GaSb, and alloys thereof, more typically selected from the group consisting of InP, InAlAs, GaInAs, AlInGaAs and GaInAsP alloys, and is most typically InP or $In_yAl_{1-y}As$ where y is between 0.44 and 0.52. One of the alternating layers of II-VI and III-V materials may be in direct contact with the InP substrate, or additional layers may be interposed between the alternating layers of II-VI and III-V materials and the InP substrate. In one embodiment, the layered construction forms one or more distributed Bragg reflectors (DBR's). Typically, such a DBR can be made with no more than 20 pairs of alternating layers of II-VI and III-V materials, and more typically no more than 15 pairs. Typically the layers of II-VI and III-V materials have an average thickness of between about 100 nm and about 200 nm.

In another aspect, the present invention provides a layered construction comprising: an InP substrate and a distributed Bragg reflector (DBR) having a reflectivity of 95% or greater which comprises no more than 15 layer pairs of epitaxial semiconductor materials.

In another aspect, the present invention provides a laser comprising a layered construction according to the present invention.

In another aspect, the present invention provides a photodetector comprising a layered construction according to the present invention.

In this application:

"lattice-matched" means, with reference to two crystalline materials, such as an epitaxial film on a substrate, that each material taken in isolation has a lattice constant, and that these lattice constants are substantially equal, typically not more than 0.2% different from each other, more typically not more than 0.1% different from each other, and most typically not more than 0.01% different from each other; and "pseudomorphic" means, with reference to a first crystalline layer of given thickness and a second crystalline layer, such as an epitaxial film and a substrate, that each layer taken in isolation has a lattice constant, and that these lattice constants are sufficiently similar so that the first layer, in the given thickness, can adopt the lattice spacing of the second layer in the plane of the layer substantially without misfit defects.

It is an advantage of the present invention to provide a layered construction that can serve as a high reflectivity DBR for use in long wavelength InP devices such as lasers or photodetectors, including VCSEL's, and, in particular, one that can achieve suitably high reflectivity with relatively few layers.

BRIEF DESCRIPTION OF THE DRAWING

FIG. 3 also presents simulated reflectivity data for the 2-pair CdZnSe/InAlAs DBR according to the present invention (trace B). FIG. 3 also presents simulated reflectivity data for two comparative III-V/III-V DBR's: a 2-pair InGaAsP/InP DBR (trace C) and a 2-pair AlGaAsSb/AlAsSb DBR (trace D).

DETAILED DESCRIPTION

Figure 1:
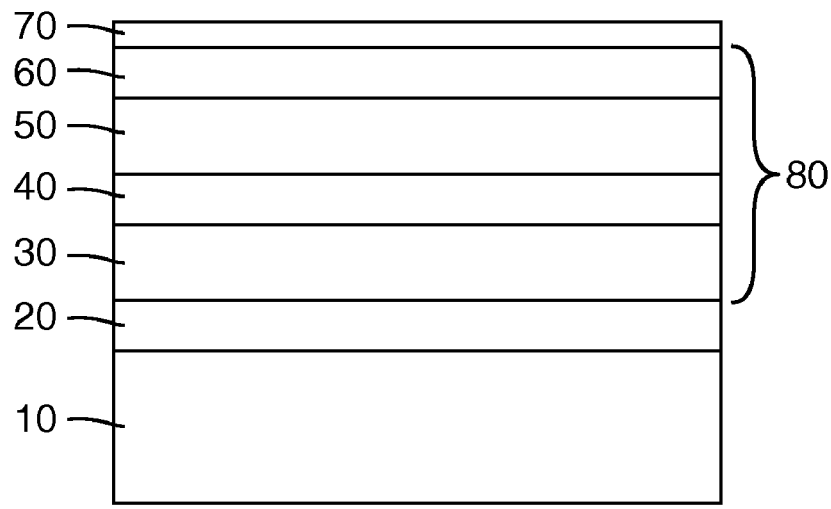
FIG. 1 is a schematic depiction of a layered construction according to the present invention which is a DBR.

Briefly, the present invention provides a layered construction comprising an InP substrate and alternating layers of II-VI and III-V materials. The alternating layers of II-VI and III-V materials are typically lattice-matched or pseudomorphic to the InP substrate.

Any suitable II-VI materials may be used in the practice of the present invention. Typically the II-VI material is selected from the group consisting of ZnSe, CdSe, BeSe, MgSe, ZnTe, CdTe, BeTe, MgTe, ZnS, CdS, BeS, MgS and alloys thereof. Suitable alloys typically include 1–4 different Group II materials and 1–3 different Group VI materials, more typically 1–3 different Group II materials and 1–2 different Group VI materials. Suitable alloys may include those according to the formula $M^1{}_n M^2{}_{(1-n)} M^3{}_p M^4{}_{(1-p)}$, where $M^1$ and $M^2$ are independently selected from Zn, Cd, Be and Mg; $M^3$ and $M^4$ are independently selected from Se, Te, and S; where n is any number between 0 and 1; where p is any number between 0 and 1. Suitable alloys may include those according to the formula $M^5{}_q M^6{}_{(1-q)} M^7$, where $M^5$ and $M^6$ are independently selected from Zn, Cd, Be and Mg; $M^7$ is selected from Se, Te, and S; and where q is any number between 0 and 1. In the preceding formulas, n, p and q are typically chosen so as to provide an alloy that is lattice-matched or pseudomorphic to InP. In one embodiment, the lattice constant of the alloy is estimated by linear interpolation from the lattice constants of the binary constituents of the alloy in order to find alloy compositions that are lattice matched or pseudomorphic to InP. More typically the II-VI material is selected from the group consisting of CdZnSe, CdMgZnSe, BeZnTe, BeMgZnTe, and most typically $Cd_x Zn_{1-x} Se$ where x is between 0.44 and 0.54. The II-VI material may be n-doped, p-doped, or undoped by any suitable method or by inclusion of any suitable dopant, including chlorine or nitrogen doping.

Any suitable III-V materials may be used in the practice of the present invention. Typically the III-V material is selected from the group consisting of InAs, AlAs, GaAs, InP, AlP, GaP, InSb, AlSb, GaSb, and alloys thereof. Suitable alloys typically include 1–3 different Group III materials and 1–3 different Group V materials, more typically 1–2 different Group V materials. Suitable alloys may include those according to the formula $M^8{}_r M^9{}_{(1-r)} M^{10}{}_s M^{11}{}_{(1-s)}$, where $M^8$ and $M^9$ are independently selected from In, Al and Ga; $M^{10}$ and $M^{11}$ are independently selected from As, P, and Sb; where r is any number between 0 and 1; where s is any number between 0 and 1. Suitable alloys may include those according to the formula $M^{12}{}_t M^{13}{}_{(1-t)} M^{14}$, where $M^{12}$ and $M^{13}$ are independently selected from In, Al and Ga; $M^{14}$ is selected from As, P, and Sb; and where t is any number between 0 and 1. In the preceding formulas, r, s and t are typically chosen so as to provide an alloy that is lattice-matched or pseudomorphic to InP. In one embodiment, the lattice constant of the alloy is estimated by linear interpolation from the lattice constants of the binary constituents of the alloy in order to find alloy compositions that are lattice matched or pseudomorphic to InP. More typically the III-V material is selected from the group consisting of InP, InAlAs, GaInAs, AlInGaAs, GaInAsP, and most typically InP or $In_y Al_{1-y} As$ where y is between 0.44 and 0.52. The III-V material may be n-doped, p-doped, or undoped by any suitable method or by inclusion of any suitable dopant.

Any suitable InP substrate may be used in the practice of the present invention. The InP substrate may be n-doped, p-doped, or semi-insulating, which may be achieved by any suitable method or by inclusion of any suitable dopant.

In one embodiment of the layered construction according to the present invention, at least one of the alternating layers of II-VI and III-V materials is in direct contact with the InP substrate. In an alternate embodiment, additional layers are interposed between the alternating layers of II-VI and III-V materials and the InP substrate. Where additional layers are interposed between the alternating layers of II-VI and III-V materials and the InP substrate, they may comprise any suitable layers. Typically, these interposed layers are lattice-matched or pseudomorphic to the InP substrate. The interposed layers may include elements of a VCSEL, such as electrical contact layers, buffer layers, optical waveguide layers, active layers, quantum well layers, current spreading layers, cladding layers, barrier layers, and the like. The interposed layers may include elements of a photodetector, such as electrical contact layers, cladding layers, absorption layers, buffer layers, and the like.

The layers of II-VI and III-V material may have any suitable thickness. The layers of II-VI and III-V material may have thicknesses, individually or on average, of between 0.1 nm and 10,000 nm, more typically between 10 and 1,000 nm, more typically between 50 nm and 500 nm, and more typically between 100 nm and 200 nm.

In one embodiment, the layered construction forms one or more distributed Bragg reflectors (DBR's). The layered construction forming the DBR may include any suitable number of pairs of II-VI and III-V materials, from 2 to a very large number. In one embodiment, the layered construction possesses sufficient reflectivity such that a DBR can be made with no more than 20 pairs of layers of II-VI and III-V materials, more typically no more than 15 pairs, more typically no more than 12 pairs, more typically no more than 10 pairs. In other embodiments, the layered construction possesses sufficient reflectivity that a suitably effective DBR can be make with no more than 8 pairs, and more typically no more than 5 pairs.

In a DBR, the layer thickness is a quarter of the wavelength of the light in that material:

$$t = \frac{\lambda}{4n}$$

where t is the thickness of the layer, λ is the wavelength of the light, n is the refractive index of the material. Take as an example a DBR mirror according to the present invention comprising $Cd_{0.52}Zn_{0.48}Se$ and $In_{0.52}Al_{0.48}As$ layers that is designed to have peak reflectivity at a wavelength of 1.55 μm. The refractive index of $Cd_{0.52}Zn_{0.48}Se$ at 1.55 μm is 2.49, and so the thickness of the $Cd_{0.52}Zn_{0.48}Se$ layer should be 156 nm. The refractive index of $In_{0.52}Al_{0.48}As$ at 1.55 μm is 3.21, and so the thickness of the $In_{0.52}Al_{0.48}As$ layer should be 121 nm. In one embodiment, the layered construction forms one or more distributed Bragg reflectors (DBR's) that have a maximum reflectivity that occurs at a wavelength in the range of 1–2 microns.

In one embodiment, the layered construction forms one or more distributed Bragg reflectors (DBR's) which form a part of a laser, such as a VCSEL. The VCSEL may operate at any suitable wavelength. In one embodiment, the VCSEL operates at a wavelength of between 1 μm and 2 μm, a range which provides for reduced dispersion and attenuation during transmission through optical fibers. Typically the VCSEL operates at wavelengths where optical fiber networks operate, typically around 1.3 μm or 1.55 μm.

In one embodiment, the layered construction forms one or more distributed Bragg reflectors (DBR's) which form a part of a photodetector. The photodetector may be used in telecommunications, where it may be capable of optical-to-electronic conversion of gigahertz frequency signals. Typical photodetectors work by absorption of optical energy and related generation of carriers, transportation of the photo-generated carriers across the absorption region, and collection of the carriers with generation of a photocurrent.

The layered construction according to the present invention may be manufactured by any suitable method, which may include molecular beam epitaxy, chemical vapor deposition, liquid phase epitaxy and vapor phase epitaxy. Typically, the layered construction according to the present invention may be manufactured without wafer fusion.

This invention is useful in opto-electronic technology, including opto-electronic communications technology.

Objects and advantages of this invention are further illustrated by the following examples, but the particular materials and amounts thereof recited in these examples, as well as other conditions and details, should not be construed to unduly limit this invention.

EXAMPLE

DBR Formation

A Distributed Bragg Reflector (DBR) mirror having 2 pairs of alternating layers of II-VI and III-V epitaxial semiconductor materials was grown on an InP substrate. The resulting structure is illustrated schematically in FIG. 1, and includes InP substrate 10, InAlAs buffer layer 20, first CdZnSe layer 30, first InAlAs layer 40, second CdZnSe layer 50, second InAlAs layer 60, and InGaAs cap layer 70. CdZnSe layers 30 and 50 and InAlAs layers 40 and 60 make up DBR 80. The II-VI material was $Cd_{0.52}Zn_{0.48}Se$ that was n-type doped with Cl. The III-V material was $In_{0.52}Al_{0.48}As$ that was n-type doped with Si.

The mirror was designed to have a peak reflectivity at 1.55 μm. For that reason, the nominal values of InAlAs and CdZnSe layer thickness were 121 nm and 156 nm, respectively.

The apparatus used was a Perkin-Elmer 430 solid source molecular beam epitaxy (MBE) system. The system includes two growth chambers connected by an ultra-high vacuum transfer tube, one of which was used for As-based III-V materials and the other for II-VI materials. The wafer was transferred back and forth between the two chambers for application of different layers via the ultra-high vacuum pipeline.

A (100)-oriented n-type, S-doped InP substrate was deoxidized in the III-V chamber at 565° C. under As overpressure. A 120 nm-thick InAlAs buffer layer was then grown at 540° C. using as deposition sources: an In effusion cell, an Al effusion cell and an As valved cracker cell. After buffer growth, the wafer was transferred to the II-VI chamber for growth of the first CdZnSe layer. The growth was initiated by a 15 minute Zn exposure at 185° C. and then a thin Cl-doped CdZnSe layer was grown at 200° C. by migration enhanced epitaxy (MEE). The substrate temperature was then ramped up to 270° C. and the remainder of the Cl-doped CdZnSe layer was grown, to a thickness of 156 nm. After CdZnSe growth, the sample was transferred back to the III-V chamber. A 5 nm-thick Si-doped InAlAs capping layer was grown at 300° C. in order to reduce the loss of any constituents of the CdZnSe layer during the high-temperature InAlAs growth. The remainder of the 121 nm-thick Si-doped InAlAs layer was then grown at 540° C., thus forming the first CdZnSe/InAlAs mirror pair. A second mirror pair was grown under the same growth conditions as the first pair. Finally, a 5 nm-thick n-InGaAs cap layer was grown on top of the structure, composed of $In_{0.53}Ga_{0.47}As$ that was n-type doped with Si.

X-Ray Diffraction

X-ray diffraction (XRD) performed on calibration samples using a Bede scientific QC1a double-crystal diffractometer confirmed that the compositions of InAlAs and CdZnSe layers on InP substrates were lattice-matched. Two separate calibration samples were grown: CdZnSe on InP substrate and InAlAs on InP substrate.

SEM

Figure 2:
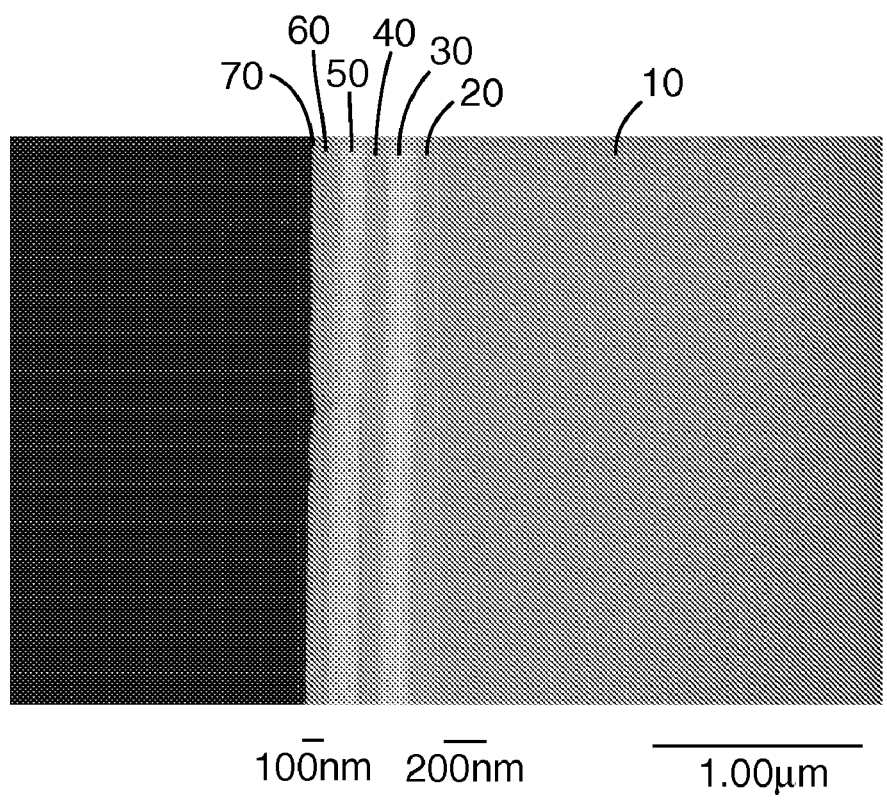
FIG. 2 is a scanning electron micrograph of a cross-section of a layered construction according to the present invention.

The DBR mirror made as described above was cross-sectioned and examined under a Hitachi S4700 scanning electron microscope (SEM). FIG. 2 is a scanning electron micrograph of that sample. The micrograph shows InP substrate 10, InAlAs buffer layer 20, first CdZnSe layer 30, first InAlAs layer 40, second CdZnSe layer 50, second InAlAs layer 60, and InGaAs cap layer 70. The micrograph shows thickness values for CdZnSe and InAlAs layers of approximately 142 nm and 116 nm respectively, somewhat thinner than the intended values.

Reflectivity

Figure 3:
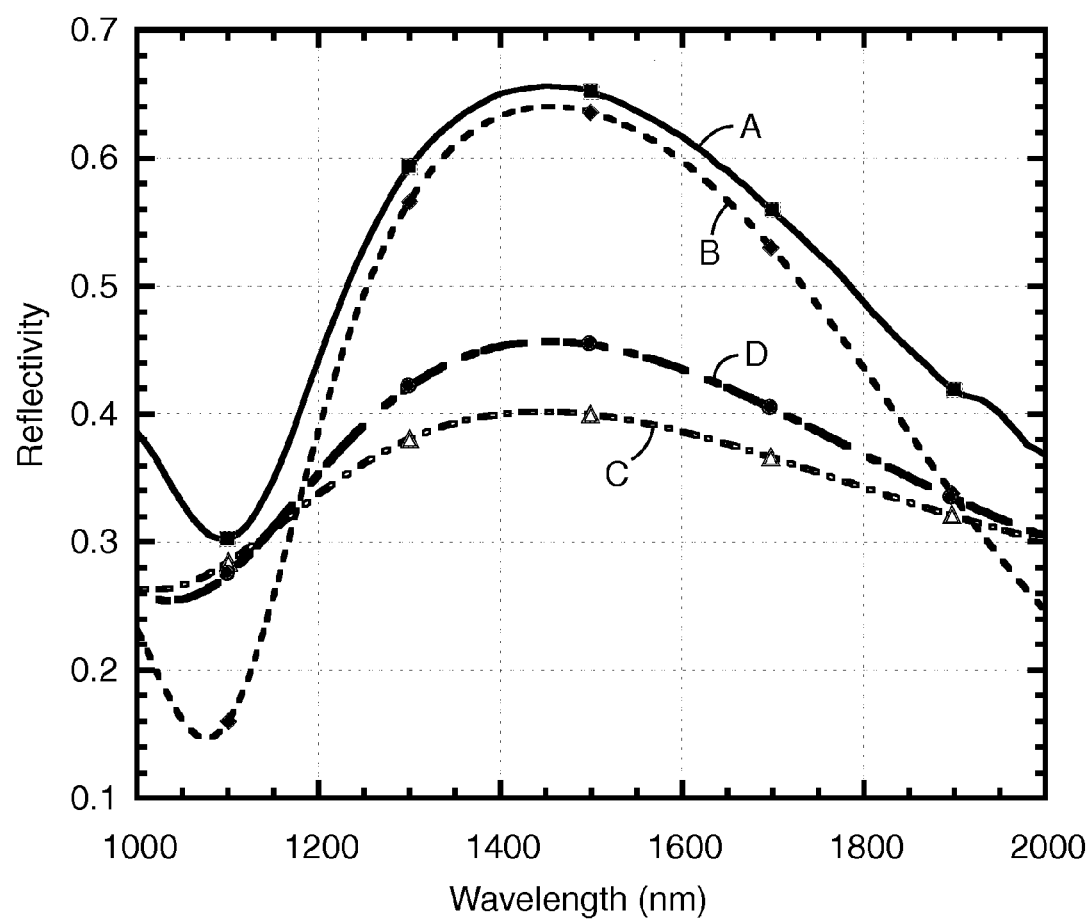
FIG. 3 is a graph of reflectivity vs. wavelength as measured for the 2-pair CdZnSe/InAlAs DBR according to the present invention described in the Example below (trace A).
Figure 4:
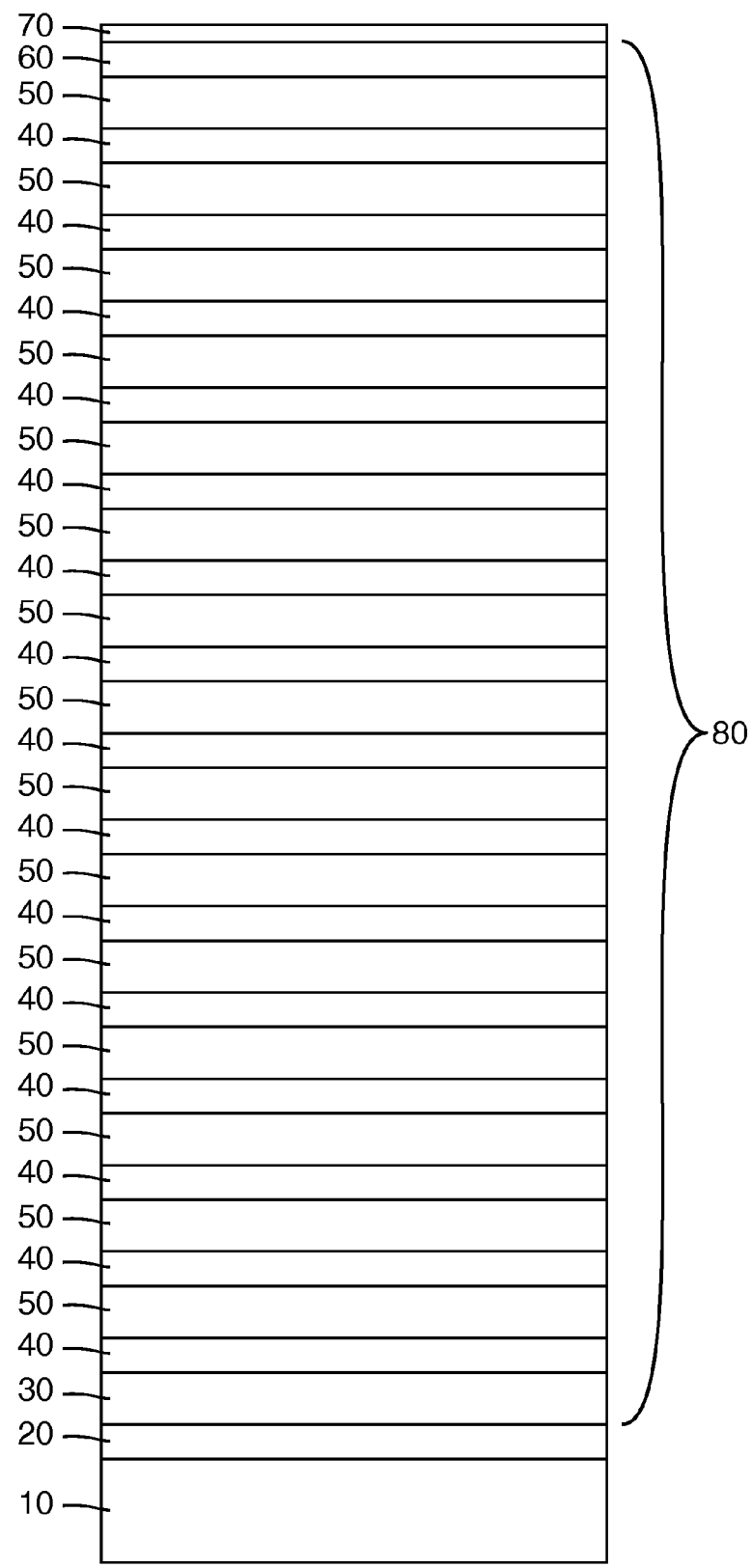
FIG. 4 is a schematic depiction of the inventive layered construction having 15 pairs of alternating layers of II-IV and III-V materials.

The reflectivity of the DBR mirror made as described above was measured using a Perkin-Elmer Lambda 900 UV/VIS/NIR spectrometer. The resulting data are presented in FIG. 3, trace A. For the 2-pair CdZnSe/InAlAs DBR mirror, the peak reflectivity was 66% at 1.45 μm. The mirror reflectivity was simulated based on transfer-matrix calculation by using the thickness values from SEM. (For more on the transfer-matrix calculation please see: Theodor Tamir (ed.), "Guided-Wave Optoelectroncs," 2nd Edition, Springer-Verlag). As evident in FIG. 3, the simulated curve (FIG. 3, trace B) fit the experimental data well. FIG. 3 also shows the simulated reflectivity as a function of wavelength for two comparative III-V/III-V DBR's: a 2-pair InGaAsP/InP (trace C) and a 2-pair AlGaAsSb/AlAsSb DBR (trace D). The reflectivity is only 46% for the 2-pair AlGaAsSb/AlAsSb DBR mirror and 40% for the 2-pair InGaAsP/InP mirror. The DBR according to the present invention demonstrates greatly improved reflectivity in comparison to currently available long wavelength DBR's of comparable thickness. Extrapolation from this data indicates that a DBR with a reflectivity of 95% can be achieved with 15 or fewer layer pairs.

Various modifications and alterations of this invention will become apparent to those skilled in the art without departing from the scope and principles of this invention, and it should be understood that this invention is not to be unduly limited to the illustrative embodiments set forth hereinabove.

We claim:

1. A layered construction comprising:
   an InP substrate; and
   alternating layers of II-VI and III-V materials;
   said II-VI material being selected from the group consisting of BeZnTe and BeMgZnTe.

2. The layered construction according to claim 1 wherein said alternating layers of II-VI and III-V materials are lattice-matched to said InP substrate or pseudomorphic to said InP substrate.

3. The layered construction according to claim 1 wherein at least one of said alternating layers of II-VI and III-V materials is in direct contact with said InP substrate.

4. The layered construction according to claim 1 additionally comprising layers interposed between said InP substrate and said alternating layers of II-VI and III-V materials.

5. The layered construction according to claim 1 wherein said alternating layers of II-VI and III-V materials form one or more distributed Bragg reflectors (DBR's).

6. The layered construction according to claim 5 wherein said distributed Bragg reflector (DBR) has a maximum reflectivity that occurs at a wavelength in the range of 1–2 microns.

7. The layered construction according to claim 5 wherein each DBR includes no more than 15 pairs of alternating layers of II-VI and III-V materials and has a reflectivity of 95% or greater.

8. The layered construction according to claim 1 wherein said III-V material is selected from the group consisting of InAs, AlAs, GaAs, InP, AlP, GaP, InSb, AlSb, GaSb, and alloys thereof.

9. The layered construction according to claim 1 wherein said III-V material is selected from the group consisting of InP, InAlAs, GaInAs, AlInGaAs, GaInAsP.

10. The layered construction according to claim 1 wherein said layers of II-VI and III-V material have an average thickness of between about 100 nm and about 200 nm.

11. A layered construction comprising:
an InP substrate; and
alternating layers of II-VI and III-V materials;
said II-VI material comprising $Cd_xZn_{1-x}Se$ where x is between 0.44 and 0.54.

12. The layered construction according to claim 11 wherein said alternating layers of II-VI and III-V materials are lattice-matched to said InP substrate or pseudomorphic to said InP substrate.

13. The layered construction according to claim 11 wherein at least one of said alternating layers of II-VI and III-V materials is in direct contact with said InP substrate.

14. The layered construction according to claim 11 additionally comprising layers interposed between said InP substrate and said alternating layers of II-VI and III-V materials.

15. The layered construction according to claim 11 wherein said alternating layers of II-IV and III-V materials form one or more distributed Bragg reflectors (DBR's).

16. The layered construction according to claim 15 wherein said distributed Bragg reflector (DBR) has a maximum reflectivity that occurs at a wavelength in the range of 1–2 microns.

17. The layered construction according to claim 15 wherein each DBR includes no more than 15 pairs of alternating layers of II-VI and III-V materials and has a reflectivity of 95% or greater.

18. The layered construction according to claim 11 wherein said III-V material is selected from the group consisting of InAs, AlAs, GaAs, InP, AlP, GaP, InSb, AlSb, GaSb, and alloys thereof.

19. The layered construction according to claim 11 wherein said III-V material is selected from the group consisting of InP, InAlAs, GaInAs, AlInGaAs, GaInAsP.

20. The layered construction according to claim 11 wherein said III-V material is $In_yAl_{1-y}As$ where y is between 0.44 and 0.52.

21. The layered construction according to claim 11 wherein said layers of II-VI and III-V material have an average thickness of between about 100 nm and about 200 nm.

22. A layered construction comprising:
an InP substrate; and
alternating layers of II-VI and III-V materials;
said III-V material comprising $In_yAl_{1-y}As$ where y is between 0.44 and 0.52.

23. The layered construction according to claim 22 wherein said alternating layers of II-VI and III-V materials are lattice-matched to said InP substrate or pseudomorphic to said InP substrate.

24. The layered construction according to claim 22 wherein at least one of said alternating layers of II-VI and III-V materials is in direct contact with said InP substrate.

25. The layered construction according to claim 22 additionally comprising layers interposed between said InP substrate and said alternating layers of II-VI and III-V materials.

26. The layered construction according to claim 22 wherein said alternating layers of II-IV and III-V materials form one or more distributed Bragg reflectors (DBR's).

27. The layered construction according to claim 26 wherein said distributed Bragg reflector (DBR) has a maximum reflectivity that occurs at a wavelength in the range of 1–2 microns.

28. The layered construction according to claim 26 wherein each DBR includes no more than 15 pairs of alternating layers of II-VI and III-V materials and has a reflectivity of 95% or greater.

29. The layered construction according to claim 22 wherein said II-VI material is selected from the group consisting of ZnSe, CdSe, BeSe, MgSe, ZnTe, CdTe, BeTe, MgTe, ZnS, CdS, BeS, MgS and alloys thereof.

30. The layered construction according to claim 22 wherein said II-VI material is selected from the group consisting of CdZnSe, CdMgZnSe, BeZnTe, BeMgZnTe.

31. The layered construction according to claim 22 wherein said II-VI material is $Cd_xZn_{1-x}Se$ where x is between 0.44 and 0.54.

32. The layered construction according to claim 22 wherein said layers of II-VI and III-V material have an average thickness of between about 100 nm and about 200 nm.

33. A layered construction comprising:
an InP substrate; and
alternating layers of II-VI and III-V materials;
said II-VI material being selected from the group consisting of CdZnSe, CdMgZnSe, BeZnTe and BeMgZnTe;
said III-V material being selected from InAlAs, GaInAs, and AlInGaAs.

34. The layered construction of claim 33 in which the III-V material comprises $In_yAl_{1-y}As$ where y is between 0.44 and 0.52.

35. The layered construction of claim 33 in which said alternating layers of II-VI and III-V materials form one or more distributed Bragg reflectors.

* * * * *